United States Patent
Chen (10) Patent No.: US 9,142,769 B2
(45) Date of Patent: Sep. 22, 2015

(54) MAGNETIC FIELD-PARTITIONED NON-VOLATILE MEMORY

(71) Applicant: Industrial Technology Research Institute, Hsinchu (TW)

(72) Inventor: Frederick T Chen, Zhubei (TW)

(73) Assignee: Industrial Technology Research Institute, Hsinchu (TW)

(*) Notice: Subject to any disclaimer, the term of this patent is extended or adjusted under 35 U.S.C. 154(b) by 0 days.

(21) Appl. No.: 14/510,405

(22) Filed: Oct. 9, 2014

(65) Prior Publication Data
US 2015/0097152 A1   Apr. 9, 2015

(30) Foreign Application Priority Data
Oct. 9, 2013  (TW) .............................. 102136455 U (51) Int. Cl.
*H01L 45/00* (2006.01)
(52) U.S. Cl.
CPC ............ *H01L 45/1253* (2013.01); *H01L 45/08* (2013.01); *H01L 45/122* (2013.01)
(58) Field of Classification Search
CPC ..... H01L 45/06; H01L 45/08; H01L 45/1233; H01L 45/1253
See application file for complete search history.

(56) References Cited

U.S. PATENT DOCUMENTS

| | | |
|---|---|---|
| 5,488,250 A | 1/1996 | Hennig |
| 5,763,928 A | 6/1998 | Hennig |
| 7,379,321 B2 | 5/2008 | Ravelosona et al. |
| 7,742,333 B2 | 6/2010 | Lee et al. |
| 2007/0096228 A1 | 5/2007 | Ahn et al. |
| 2015/0097152 A1* | 4/2015 | Chen ................................ 257/4 |

FOREIGN PATENT DOCUMENTS

| | | |
|---|---|---|
| TW | 200410247 | 6/2004 |
| TW | 200735098 | 9/2007 |
| TW | 201113540 A | 4/2011 |

OTHER PUBLICATIONS

Roukes, et al., Quenching of the Hall Effect in a One-Dimensional Wire, *Physical Review Letters*, vol. 59, No. 26, Dec. 28, 1987, 5 pgs.
Chueh, et al., Electrochemical Studies of Capacitance in Cerium Oxide Thin Films and its Relationship to Anionic and Electronic Defect Densities, *Phys. Chem. Chem. Phys.*, Jul. 27, 2009, 11, 5 pgs.
Zhong-Wen, et al., Bipolar Resistive Switching in Cr-doped TiOx Thin Films, *Chinese Phys. B*, vol. 20, No. 9, 2011, 4 pgs.

(Continued)

*Primary Examiner* — Mark Prenty
(74) *Attorney, Agent, or Firm* — Muncy, Geissler, Olds & Lowe, P.C.

(57) ABSTRACT

A non-volatile memory cell and a magnetic field-partitioned non-volatile memory for multi-bit storage are provided. The non-volatile memory cell for multi-bit storage includes a bottom electrode. A resistance-changing memory material covers the bottom electrode. A top electrode including a high-mobility material is disposed on the resistance-changing memory material. The top electrode has two post portions supporting a bar-shaped portion. At least two bits are stored in portions of the resistance-changing memory material connecting to the top electrode when an external magnetic field is applied along different directions.

17 Claims, 7 Drawing Sheets

(56) References Cited

OTHER PUBLICATIONS

Namba, et al., On-Chip Vertically Coiled Solenoid Inductors and Transformers for RF SoC Using 90 nm CMOS Interconnect Technology, *Radio Frequency Integrated Circuits Symposium* (RFIC), 2011, 4 pgs. DOI: 10.1109/RFIC.2011.5940640.

Schult, et al., Quantum Hall Effect and General Narrow-Wire Circuits, Phys. Rev. B vol. 41, No. 18, Jun. 15, 1990, 21 pgs.

\* cited by examiner

MAGNETIC FIELD-PARTITIONED NON-VOLATILE MEMORY

CROSS REFERENCE TO RELATED APPLICATIONS

This application claims priority of Taiwan Patent Application No. 102136455, filed on Oct. 9, 2013, the entirety of which is incorporated by reference herein.

TECHNICAL FIELD

The disclosure relates to a magnetic field-partitioned non-volatile memory, and relates to a magnetic field-partitioned resistive random access memory (RRAM) or conductive bridging random access memory (CBRAM) for multi-bit storage.

BACKGROUND

Resistive random access memories (RRAM) have recently gained tremendous popularity due to fast (~ns) resistance switching while consuming low power (<mW). A key advantage of RRAM is the scalability of its simple structure. However, at ~10 nm design rules, the line resistance becomes too significant to ignore. Three dimensional (3D) non-volatile memories have been proposed to increase bit density at looser design rules, but each array layer stacked vertically adds area to the silicon periphery outside of the array, as well as many more additional film deposition and etching process steps, leading to a net increase in cost.

SUMMARY

A non-volatile memory cell and a magnetic field-partitioned non-volatile memory for multi-bit storage are provided. An embodiment of a non-volatile memory cell for multi-bit storage comprises a bottom electrode. A resistance-changing memory material covers the bottom electrode. A top electrode including a high-mobility material is disposed on the resistance-changing memory material. The top electrode has two post portions supporting a bar-shaped portion. At least two bits are stored in portions of the resistance-changing memory material connecting to the top electrode when an external magnetic field is applied along different directions.

Another embodiment of a non-volatile memory cell for multi-bit storage comprises a bottom electrode including a high-mobility material. The bottom electrode has an annular portion supported by a cylindrical portion. A resistance-changing memory material covers the bottom electrode. A top electrode is disposed on the resistance-changing memory material. At least two bits are stored in portions of the resistance-changing memory material connecting to the bottom electrode when an external magnetic field is applied along different directions.

An embodiment of a magnetic field-partitioned non-volatile memory for multi-bit storage comprises a plurality of non-volatile memory cells arranged as a non-volatile memory array. The non-volatile memory cell comprises a bottom electrode including a high-mobility material. The bottom electrode has an annular portion supported by a cylindrical portion. A resistance-changing memory material covers the bottom electrode. A top electrode is disposed on the resistance-changing memory material. At least two bits are stored in portions of the resistance-changing memory material connecting to the bottom electrode when an external magnetic field is applied along different directions. There are at least two on-chip solenoids respectively surrounding the non-volatile memory array to generate external magnetic fields.

Another embodiment of a magnetic field-partitioned non-volatile memory for multi-bit storage comprises a plurality of non-volatile memory cells arranged as a non-volatile memory array. The non-volatile memory cell comprises a bottom electrode. A resistance-changing memory material covers the bottom electrode. A top electrode including a high-mobility material is disposed on the resistance-changing memory material. The top electrode has two post portions supporting a bar-shaped portion. At least two bits are stored in portions of the resistance-changing memory material connecting to the top electrode when an external magnetic field is applied along different directions. There is at least one on-chip solenoid adjacent the non-volatile memory array to generate an external magnetic field.

A detailed description is given in the following embodiments with reference to the accompanying drawings.

BRIEF DESCRIPTION OF THE DRAWINGS

The embodiment can be more fully understood by reading the detailed description and examples with references made to the accompanying drawings, wherein.

DETAILED DESCRIPTION OF THE DISCLOSURE

The following description is of the embodiment of carrying out the disclosure. This description is made for the purpose of illustrating the general principles of the embodiment and should not be taken in a limiting sense. The scope of the embodiment is determined by reference to the appended claims.

Embodiments provide a non-volatile memory cell for multi-bit storage. The non-volatile memory structure described herein is a resistive random access memory (RRAM) cell or conductive bridging random access memory (CBRAM) cell using an external magnetic field to partition bit storage portions to achieve multi-bit storage.

Figure 1A:
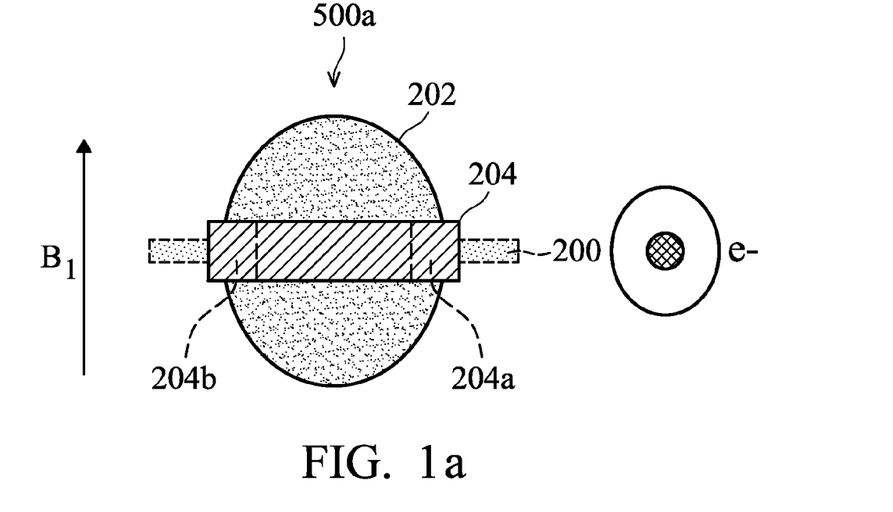
FIG. 1a is a top view showing a non-volatile memory cell for multi-bit storage according to an embodiment.
Figure 1B:
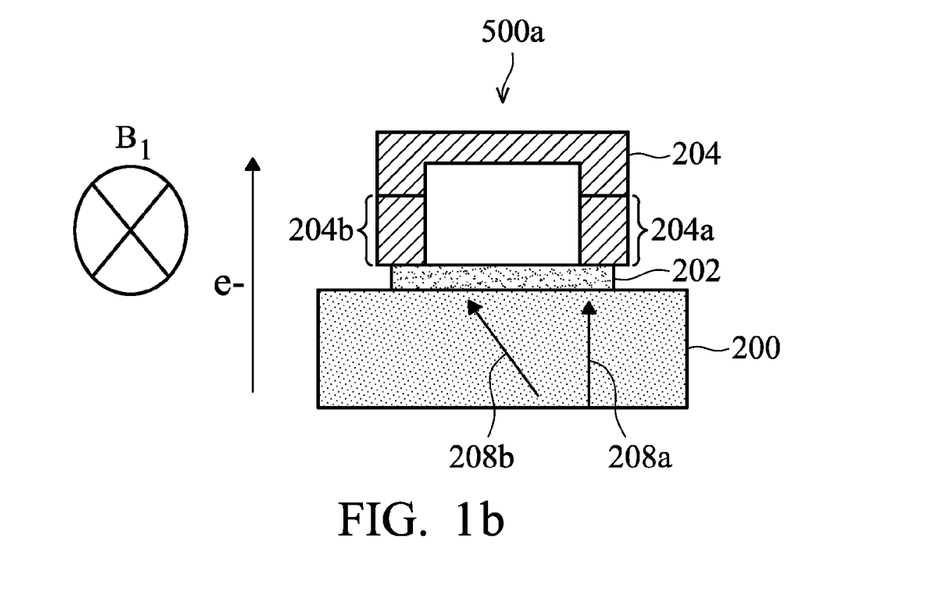
FIG. 1b is a cross section showing a non-volatile memory cell for multi-bit storage according to an embodiment.

FIG. 1a is a top view showing a non-volatile memory cell 500a for multi-bit storage according to an embodiment. FIG. 1b is a cross section showing a non-volatile memory cell 500a for multi-bit storage according to an embodiment. As shown in FIGS. 1a and 1b, the non-volatile memory cell 500a comprises a bottom electrode 200, a resistance-changing memory material 202 and a top electrode 204. In one embodiment, the bottom electrode 200, the resistance-changing memory material 202 and the top electrode 204 may be respectively formed in different layers, which are laminated vertically using a deposition method, for example, a chemical vapor deposition (CVD) method or an atomic layer deposition (ALD) method. In one embodiment, the bottom electrode 200 is made of a high-mobility (>10,000 m²/v-s) material (not shown), such as indium antimonide (InSb), carbon nanotube (CNT) or graphene. A high mobility material allows carriers to be affected by the magnetic field as easily as the electric field, due to the relation $\mu=v/E$, and the force definitions $F_E=qE$, $F_B=qvB\sin\theta$ ($\theta$=angle between v and B). The bottom electrode 200 may be formed by a deposition method, for example, a physical vapor deposition (PVD) method, sputtering method, plating method or an atomic layer deposition (ALD) method, and a patterning process. As shown in FIG. 1a, the bottom electrode 200 is stripe shaped from the top view.

As shown in FIGS. 1a and 1b, the resistance-changing memory material 202 covers a part of the bottom electrode 200. In one embodiment, the resistance-changing memory material 202 may comprise an RRAM oxide such as an $HfO_2$. The resistance-changing memory material 202 may be formed by a deposition method, for example, a chemical vapor deposition (CVD) method, sputtering method or an atomic layer deposition (ALD) method, and a patterning process. In this embodiment as shown in FIG. 1a, the resistance-changing memory material 202 is circular shaped from a top view. Also, an area of the bottom electrode 200 overlapping with the resistance-changing memory material 202 is smaller than an area of the resistance-changing memory material 202 from the top view as shown in FIG. 1a.

Still referring to FIGS. 1a and 1b, the top electrode 204 is formed on the resistance-changing memory material 202. In one embodiment, the top electrode 204 is made of a high-mobility (>10,000 m²/v-s) material (not shown), such as indium antimonide (InSb), carbon nanotube (CNT) or graphene. The top electrode 204 may be formed by a deposition method, for example, a physical vapor deposition (PVD) method, sputtering method, plating method or an atomic layer deposition (ALD) method, and a patterning process. As shown in FIG. 1a, the top electrode 204 is bar-shaped from the top view. As shown in FIG. 1b, the top electrode 204 is upside-down U-shaped from a cross section, i.e., it has two post portions supporting a bar-shaped portion. In this embodiment, the top electrode 204 has at least two ends 204a and 204b respectively overlapping with the bottom electrode 200, connecting to the resistance-changing memory material 202 from the top view. Also, an area of the top electrode 204 connecting with the resistance-changing memory material 202 is smaller than an area of the resistance-changing memory material 202 from the top view as shown in FIG. 1a. Further, an area of the bottom electrode 200 overlapping with the at least two ends 204a and 204b of the top electrode 204 is smaller than a total area of the at least two ends 204a and 204b of the top electrode 204 overlapping with the resistance-changing memory material 202 from the top view as shown in FIG. 1a.

Figure 2A:
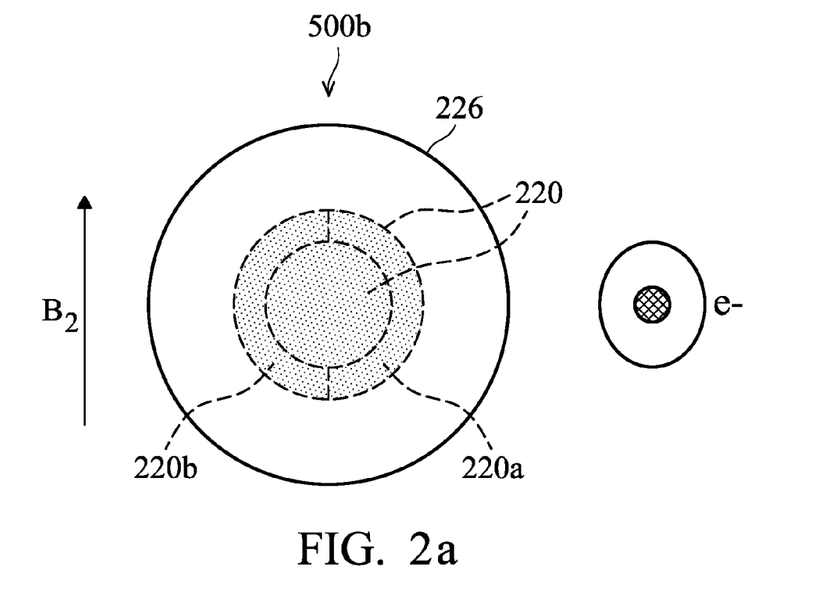
FIG. 2a is a top view showing a non-volatile memory cell for multi-bit storage according to another embodiment.
Figure 2B:
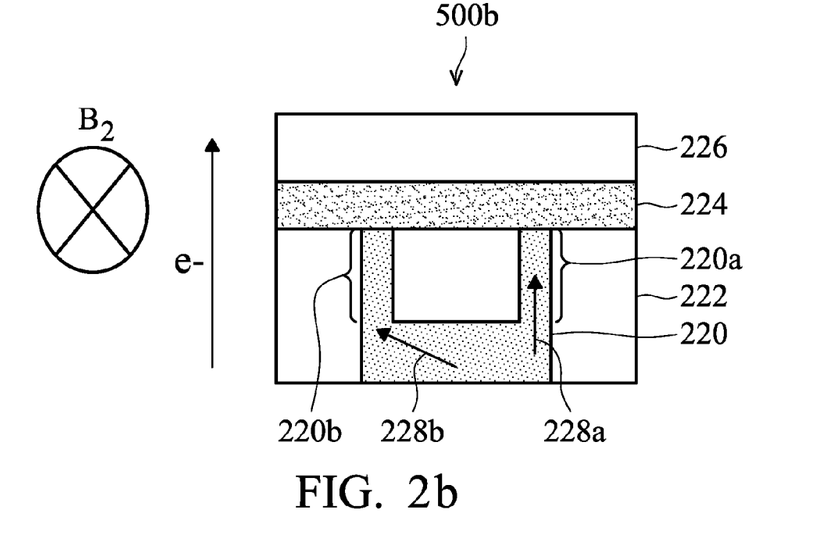
FIG. 2b is a cross section of a non-volatile memory cell for multi-bit storage according to another embodiment.

Alternative embodiments may have different designs for the top electrode, the bottom electrode or the resistance-changing memory material of the non-volatile memory cell to achieve multi-bit storage. FIG. 2a is a top view showing a non-volatile memory cell 500b for multi-bit storage according to another embodiment. FIG. 2b is a cross section of a non-volatile memory cell 500b for multi-bit storage according to another embodiment. Elements of the embodiments hereinafter, that are the same or similar as those previously described with reference to FIGS. 1a-1b, are not repeated for brevity. As shown in FIGS. 2a and 2b, the non-volatile memory cell 500b comprises a bottom electrode 220, a resistance-changing memory material 224 and a top electrode 226. In one embodiment, the bottom electrode 220, the resistance-changing memory material 224 and the top electrode 226 may be respectively formed in different insulating layers, which are laminated vertically using a deposition method, for example, a chemical vapor deposition (CVD) method or an atomic layer deposition (ALD) method. In one embodiment, the bottom electrode 220 is made of a high-mobility (>10,000 m²/v-s) material (not shown), such as indium antimonide (InSb), carbon nanotube (CNT) or graphene. The bottom electrode 220 may be formed in an insulating layer 222 by a deposition method, for example, a physical vapor deposition (PVD) method, sputtering method, plating method or an atomic layer deposition (ALD) method, and a patterning process. As shown in FIGS. 2a and 2b, the bottom electrode 220 is U-shaped from a cross section, i.e., it has a cylindrical portion supporting an annular portion. In this embodiment, the insulating layer 222 may be an insulating layer with a high breakdown voltage (VBD) in the range of 5 V to 10 V.

As shown in FIGS. 2a and 2b, the resistance-changing memory material 224 covers the bottom electrode 220. In one embodiment, the resistance-changing memory material 224 may comprise an RRAM oxide such as $HfO_2$. The resistance-changing memory material 224 may be formed by a deposition method, for example, a chemical vapor deposition (CVD) method, sputtering method or an atomic layer deposition (ALD) method, and a patterning process. In this embodiment as shown in FIG. 2a, the resistance-changing memory material 224 is circular shaped from a top view. Alternatively, the resistance-changing memory material 224 may be other geometric shapes, for example, square shaped, triangular shaped or rectangular shaped from the top view. Also, an area of the bottom electrode 220 connecting to the resistance-changing memory material 224 is smaller than an area of the resistance-changing memory material 224 from the top view as shown in FIG. 2a. Also, a surface of the bottom electrode 220 connecting to the resistance-changing memory material 224 is circular-ring shaped from the top view (dotted line). Alternatively, the surface of the bottom electrode 220 may be other geometric-ring shapes, for example, square-ring shaped, triangular-ring shaped or rectangular-ring shaped from the top view.

Still referring to FIGS. 2a and 2b, the top electrode 226 is formed on the resistance-changing memory material 224. In one embodiment, the top electrode 226 is made of a high-mobility (>10,000 m²/v-s) material (not shown), such as indium antimonide (InSb), carbon nanotube (CNT) or graphene. The top electrode 226 may be formed by a deposition method, for example, a physical vapor deposition (PVD) method, sputtering method, plating method or an atomic layer deposition (ALD) method, and a patterning process. As shown in FIG. 2a, the top electrode 226 may have a shape the same as the resistance-changing memory material 224 from the top view. In this embodiment as shown in FIG. 2a, the top electrode 226 is circular shaped from a top view. Alternatively, the top electrode 226 may be other geometric shapes, for example, square shaped, triangular shaped or rectangular shaped from the top view. Further, an area of the top electrode 226 connecting to the resistance-changing memory material 234 is the same as an area of the resistance-changing memory material 23 from the top view as shown in FIG. 2a. Therefore, the top electrode 226 may fully covers and fully overlaps with the resistance-changing memory material 224.

In this embodiment, the bottom electrode 220 has at least two end portions 220a and 220b respectively overlapping with the top electrode 226, connecting to the resistance-changing memory material 224 from the cross section view as shown in FIG. 2b. Also, an area of the bottom electrode 220 connecting to the resistance-changing memory material 226 is smaller than an area of the resistance-changing memory material 226 from the top view as shown in FIG. 2a. Therefore, an area of the top electrode 226 overlapping with the resistance-changing memory material 226 is larger than an area of the bottom electrode 220 connecting to the resistance-changing memory material 226 from the top view.

Figure 3A:
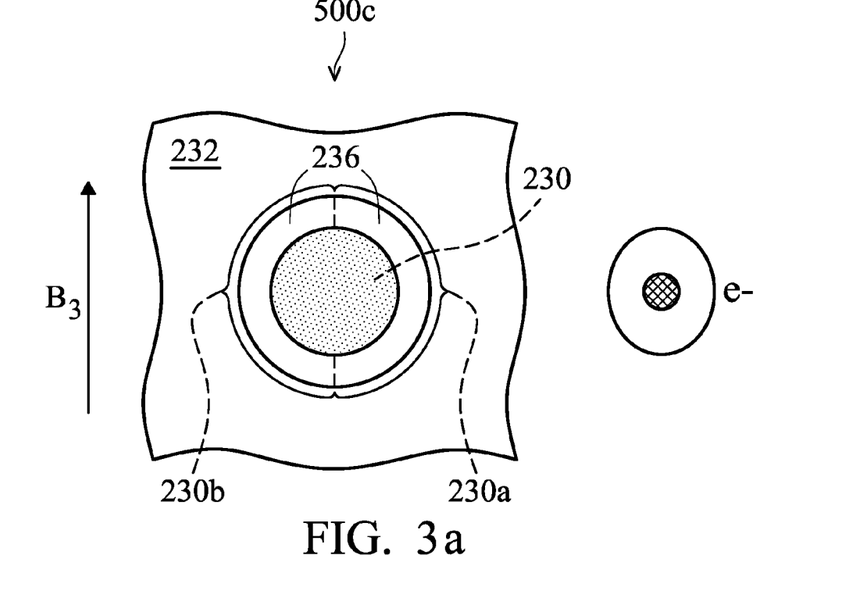
FIG. 3a is a top view showing a non-volatile memory cell for multi-bit storage according to yet another embodiment.
Figure 3B:
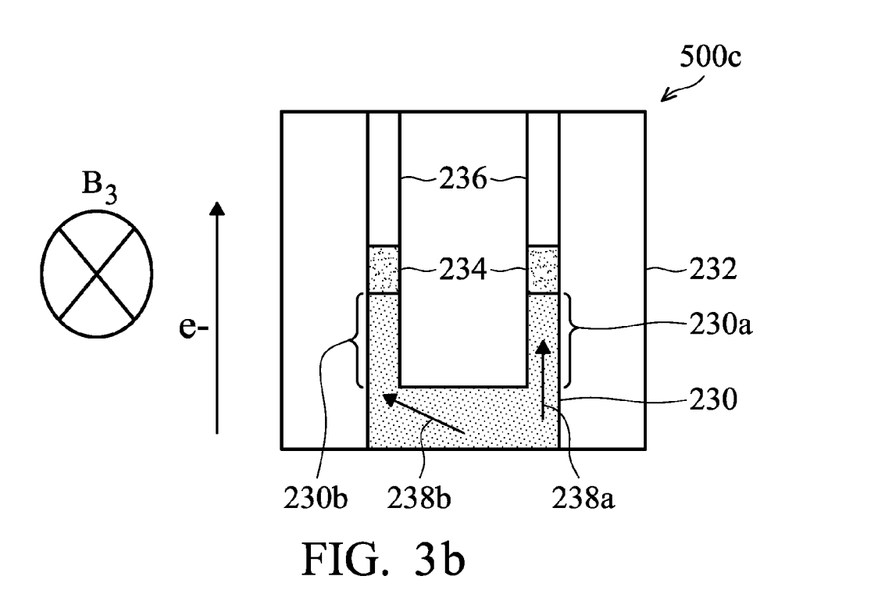
FIG. 3b is a cross section of a non-volatile memory cell for multi-bit storage according to yet another embodiment.

FIG. 3a is a top view showing a non-volatile memory cell 500c for multi-bit storage according to another embodiment of the disclosure. FIG. 3b is a cross section of a non-volatile memory cell 500c for multi-bit storage according to another embodiment of the disclosure. Elements of the embodiments hereinafter, that are the same or similar as those previously described with reference to FIGS. 1a-1b and 2a-2b, are not repeated for brevity. As shown in FIGS. 3a and 3b, the non-volatile memory cell 500c comprises a bottom electrode 230, a resistance-changing memory material 234 and a top electrode 236. In one embodiment, the bottom electrode 230, the resistance-changing memory material 234 and the top electrode 236 may be formed in an insulating layer 232, which is formed by a deposition method, for example, a chemical vapor deposition (CVD) method or an atomic layer deposition (ALD) method. In one embodiment, the bottom electrode 230 is made of a high-mobility (>10,000 m$^2$/v-s) material (not shown), such as indium antimonide (InSb), carbon nanotube (CNT) or graphene. The bottom electrode 230 may be formed in the insulating layer 232 by a deposition method, for example, a physical vapor deposition (PVD) method, sputtering method, plating method or an atomic layer deposition (ALD) method, and a patterning process. As shown in FIGS. 3a and 3b, the bottom electrode 230 is U-shaped from a cross section, i.e., it has a cylindrical portion supporting an annular portion. In this embodiment, the insulating layer 232 may be an insulating layer with a high breakdown voltage (Vbd>5V).

As shown in FIGS. 3a and 3b, the resistance-changing memory material 234 covers the bottom electrode 230. In one embodiment, the resistance-changing memory material 234 may comprise an RRAM oxide such as HfO$_2$. The resistance-changing memory material 234 may be formed by a deposition method, for example, a chemical vapor deposition (CVD) method, sputtering method or an atomic layer deposition (ALD) method, and a patterning process. In this embodiment as shown in FIG. 3a, the resistance-changing memory material 234 is circular-ring shape from a top view. Alternatively, the resistance-changing memory material 234 may be other geometric-ring shapes, for example, square-ring shaped, triangular-ring shaped or rectangular-ring shaped from the top view. As shown in FIG. 3a, a surface of the bottom electrode 230 connecting to the resistance-changing memory material 234 may have a shape the same as a surface of the resistance-changing memory material 234 from the top view. In this embodiment as shown in FIG. 3a, the surface of the bottom electrode 230 connecting to the resistance-changing memory material 234 is circular-ring shaped from a top view. Alternatively, the surface of the bottom electrode 230 connecting to the resistance-changing memory material 234 may be other geometric-ring shapes, for example, square-ring shaped, triangular-ring shaped or rectangular-ring shaped from the top view. Further, an area of the bottom electrode 230 connecting to the resistance-changing memory material 234 is the same as an area of the resistance-changing memory material 234 from the top view as shown in FIG. 3a. Therefore, the resistance-changing memory material 234 may fully covers and may fully overlaps with the surface of the bottom electrode 230 connecting to the resistance-changing memory material 234.

Still referring to FIGS. 3a and 3b, the top electrode 236 is formed on the resistance-changing memory material 234. In one embodiment, the top electrode 236 is made of a high-mobility (>10,000 m$^2$/v-s) material (not shown), such as—indium antimonide (InSb), carbon nanotube (CNT) or graphene. The top electrode 236 may be formed by a deposition method, for example, a physical vapor deposition (PVD) method, sputtering method, plating method or an atomic layer deposition (ALD) method, and a patterning process. As shown in FIG. 3a, the top electrode 236 may have a shape the same as the resistance-changing memory material 234 from the top view. Also, the top electrode 236 may have a shape the same as the surface of the bottom electrode 230 connecting to the resistance-changing memory material 234. In this embodiment as shown in FIG. 3a, the top electrode 236, the resistance-changing memory material 234 and the surface of the bottom electrode 230 connecting to the resistance-changing memory material 234 are circular-ring shape from a top view. Alternatively, the top electrode 236 may be other geometric-ring shapes, for example, square-ring shaped, triangular-ring shaped or rectangular-ring shaped from the top view. Further, an area of the top electrode 236 connecting to the resistance-changing memory material 234 is the same as an area of the resistance-changing memory material 234 from the top view as shown in FIG. 3a. Therefore, the top electrode 236 may fully covers and fully overlaps with the resistance-changing memory material 234.

In this embodiment, the bottom electrode 230 is shaped to have at least two end portions 230a and 230b respectively overlapping with at least two end portions 236a and 236b of the top electrode 236, connecting to the resistance-changing memory material 224 from the cross section view as shown in FIG. 3b. Also, an area of the bottom electrode 230 connecting with the resistance-changing memory material 234 is the same as an area of the top electrode 236 connecting with the resistance-changing memory material 234 from the top view as shown in FIG. 3a.

In the aforementioned embodiments of the non-volatile memory cell for multi-bit storage, the top electrode or the bottom electrode is designed to have at least two end portions from the cross section view. When external magnetic fields along different directions are applied through the non-volatile memory cell (500a, 500b or 500c), at least two bits can be stored in multiple independent portions of the resistance-changing memory material, which respectively connect to the at least two end portions of the top electrode or the bottom electrode. The resistance-changing memory material of the non-volatile memory cell for multi-bit storage according to embodiments may have oxygen vacancies therein. As the non-volatile memory cell, for example, an RRAM, applies conducting filaments consisting of oxygen vacancies as bit storage locations at specific locations in the non-volatile memory cell (the resistance-changing memory material). The conducting filaments arise from localized currents to change (reduce) resistances of the resistance-changing memory material. These currents for producing and rupturing filaments may be positioned without using additional electrodes, by means of the Hall effect with an externally applied magnetic field.

Figure 4A:
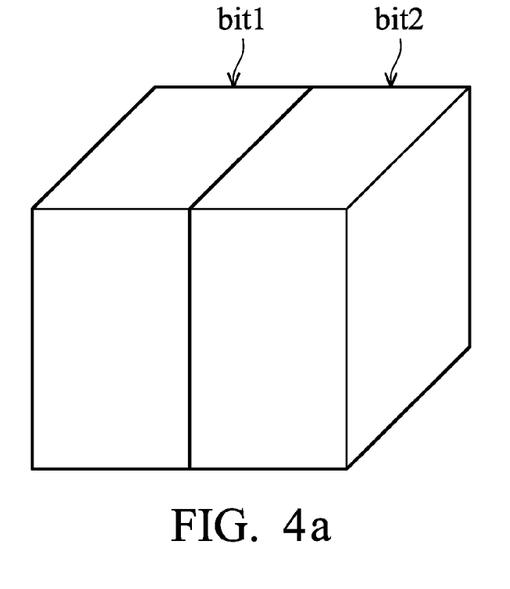
FIGS. 4a to 4e are schematic views showing operations for a non-volatile memory cell for multi-bit storage, including write, read and RESET operations according to an embodiment.
Figure 4B:
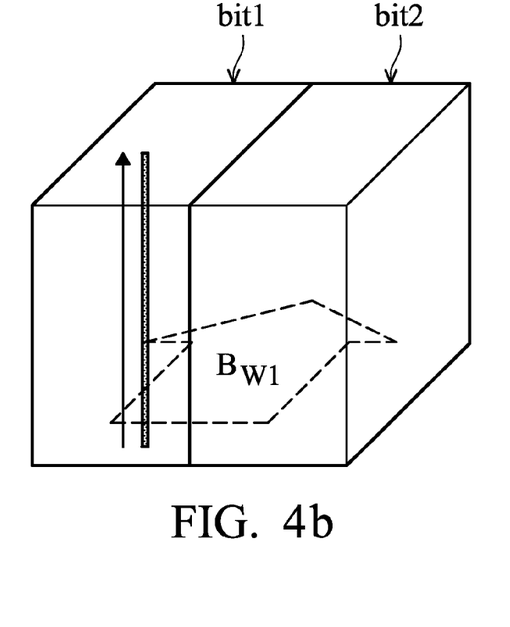
Figure 4C:
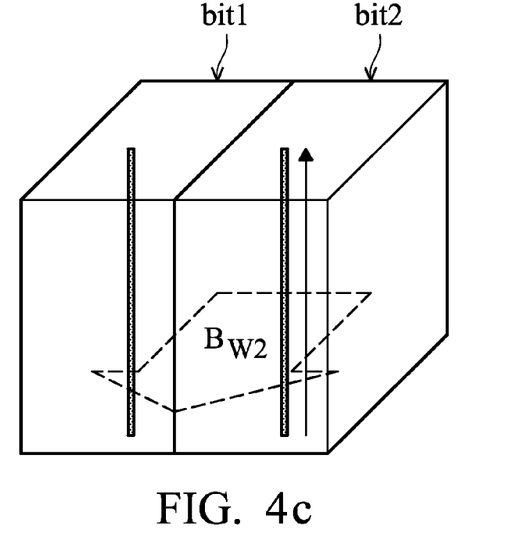
Figure 4D:
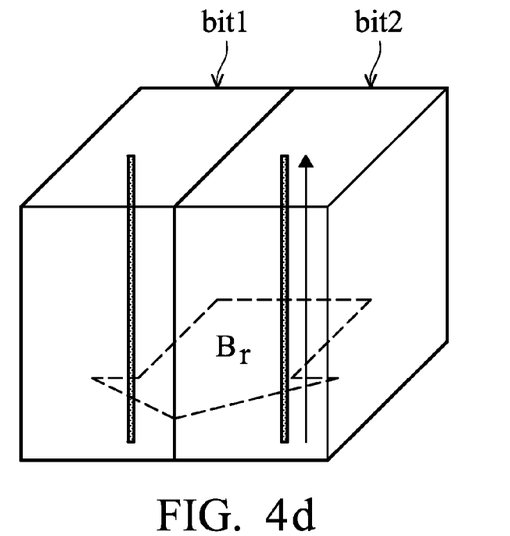
Figure 4E:
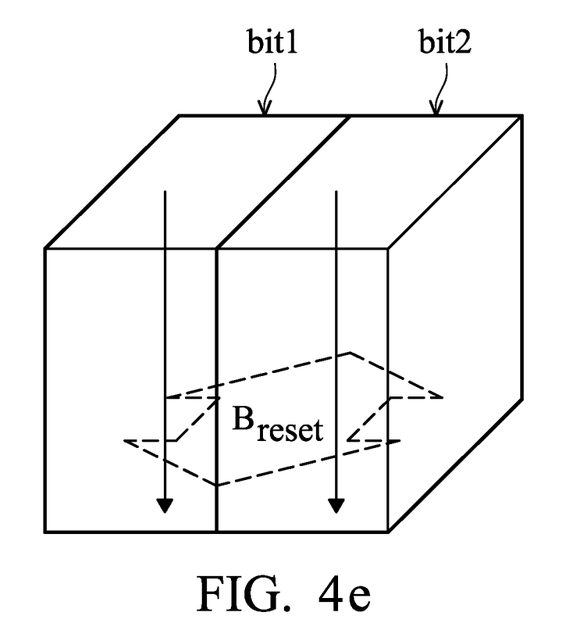

FIGS. 4a to 4e are schematic views showing writing, reading and re-setting (RESET) operations of a non-volatile memory cell for two-bit storage according to an embodiment. In FIGS. 4a to 4e, elements bit 1 and bit 2 respectively correspond to the different portions of the resistance-changing memory material, which respectively connect to the at least two end portions of the top electrode or the bottom electrode to change resistances of the resistance-changing memory material using an external magnetic field, for bit storage. FIG. 4a illustrates an initial state of the non-volatile memory cell for two-bit storage according to an embodiment of the disclosure. As shown in FIG. 4b, a one-bit writing operation of the non-volatile memory cell for two-bit storage according to an embodiment comprises applying an external magnetic field $B_{w1}$ along a direction pointed into the paper surface (labeled by a hollow arrow surrounding the external magnetic field $B_{w1}$), so that an induced current along an upward direction, which is also parallel to the paper surface (labeled by an arrow positioned in the bit 1), changes the resistance of bit 1. Therefore, a bit is stored in bit 1 (labeled by a bold line in the bit 1). As shown in FIG. 4c, a second-bit writing operation of the non-volatile memory cell for two-bit storage according to an embodiment comprises applying the external magnetic field $B_{w2}$ along another direction pointed out of the paper surface (labeled by a hollow arrow surrounding the external magnetic field $B_{w2}$), so that an induced current along an upward direction, which is also parallel to the paper surface (labeled by an arrow positioned in the bit 2), changes the resistance of bit 2. Therefore, a bit is stored in bit 2 (labeled by a bold line in the bit 2). As shown in FIG. 4d, a second-bit reading operation of the non-volatile memory cell for two-bit storage according to an embodiment comprises applying the external magnetic field $B_r$ along the direction pointed out of the paper surface (labeled by a hollow arrow surrounding the external magnetic field Br), so that an induced current flowing through the bit 2 along an upward direction, which is also parallel to the paper surface (labeled by an arrow positioned in the bit 2), can be measured. Similarly, a first-bit reading operation of the non-volatile memory cell for two-bit storage according to an embodiment comprises applying the external magnetic field Br along the direction pointed into of the paper surface (labeled by a hollow arrow surrounding the external magnetic field Br), so that an induced current along an upward direction flowing through the bit 1, which is also parallel to the paper surface (labeled by an arrow positioned in the bit 1), can be measured (not shown). The external magnetic field $B_r$ for first-bit or second-bit reading operations of the non-volatile memory cell for two-bit storage is designed to be less than the external magnetic field $B_w$ for the first-bit or second-bit writing operations. Further, as shown in FIG. 4e, a first-bit and second-bit re-setting operation of the non-volatile memory cell for two-bit storage according to an embodiment comprises applying the external magnetic field $B_{reset}$ along directions pointed in and out of the paper surface (labeled by a hollow arrow surrounding the external magnetic field $B_{reset}$), so that an induced current along a downward direction, which is also parallel to the paper surface (labeled by an arrow positioned in the bit 1 and bit 2), initializes the resistance of bit 1 and bit 2. The external magnetic field $B_{reset}$ for first-bit or second-bit re-setting operations of the non-volatile memory cell for two-bit storage is designed less or more than the external magnetic field $B_w$ for the first-bit or second-bit writing operation.

Also, the writing operation as shown in FIGS. 4b and 4c may be applied to non-volatile memory cells 500a-500c for multi-bit storage. Please refer to FIGS. 1a and 1b again. When the non-volatile memory cell 500a is applied with an external magnetic field $B_1$ along a direction parallel to a top surface of the resistance-changing memory material 202, an induced electron current flows along a direction perpendicular to a top surface of the resistance-changing memory material 202 (labeled by an arrow with an element e−). Therefore, induced currents 208a and 208b from the bottom electrode 200 may respectively flow through portions of the resistance-changing memory material 202 connecting to the at least two ends 204a and 204b of the top electrode 204. The induced current 208b is weaker than the induced current 208a because a current path of the induced current 208b is suffers from a larger internal resistance than that of the induced current 208a. Therefore, one portion of the resistance-changing memory material 202, which connects to the end 204a, can change the resistance thereof. After applying the external magnetic field $B_1$ to the non-volatile memory cell 500a, one bit is stored in the portion of the resistance-changing memory material 202 connecting to the end 204a. Similarly, another external magnetic field along a direction inverse to the direction of the external magnetic field $B_1$ may write another bit to the portion of the resistance-changing memory material 202 connecting to the end 204b to store two-bits in a signal cell.

Please refer to FIGS. 2a and 2b again. When the non-volatile memory cell 500b is applied with an external magnetic field $B_2$ along a direction parallel to a top surface of the resistance-changing memory material 224, an induced electron current flows along a direction perpendicular to a top surface of the resistance-changing memory material 224 (labeled by an arrow with an element e−). Therefore, induced currents 228a and 228b from the bottom electrode 220 may respectively flow through portions of the resistance-changing memory material 224 connecting to the at least two end portions 220a and 220b of the bottom electrode 220. The induced current 228b is weaker than the induced current 208a because a current path of the induced current 228b suffers from a larger internal resistance than that of the induced current 228a. After applying the external magnetic field $B_2$ to the non-volatile memory cell 500b, one bit is stored in the portion of the resistance-changing memory material 224 connecting to the end portion 220a of the bottom electrode 220.

Please refer to FIGS. 3a and 3b again. When the non-volatile memory cell 500c is applied with an external magnetic field $B_3$ along a direction parallel to a top surface of the resistance-changing memory material 234, an induced electron current flows along a direction perpendicular to a top surface of the resistance-changing memory material 234 (labeled by an arrow with an element e−). Therefore, induced currents 238a and 238b from the bottom electrode 230 may respectively flow through portions of the resistance-changing memory material 234 connecting to the at least two end portions 230a and 230b of the bottom electrode 230. The induced current 238b is weaker than the induced current 208a because a current path of the induced current 238b suffers from a larger internal resistance than that of the induced current 238a. After applying the external magnetic field $B_3$ to the non-volatile memory cell 500c, one bit is stored in the portion of the resistance-changing memory material 234 connecting to the end portion 230a of the bottom electrode 230.

Figure 5:
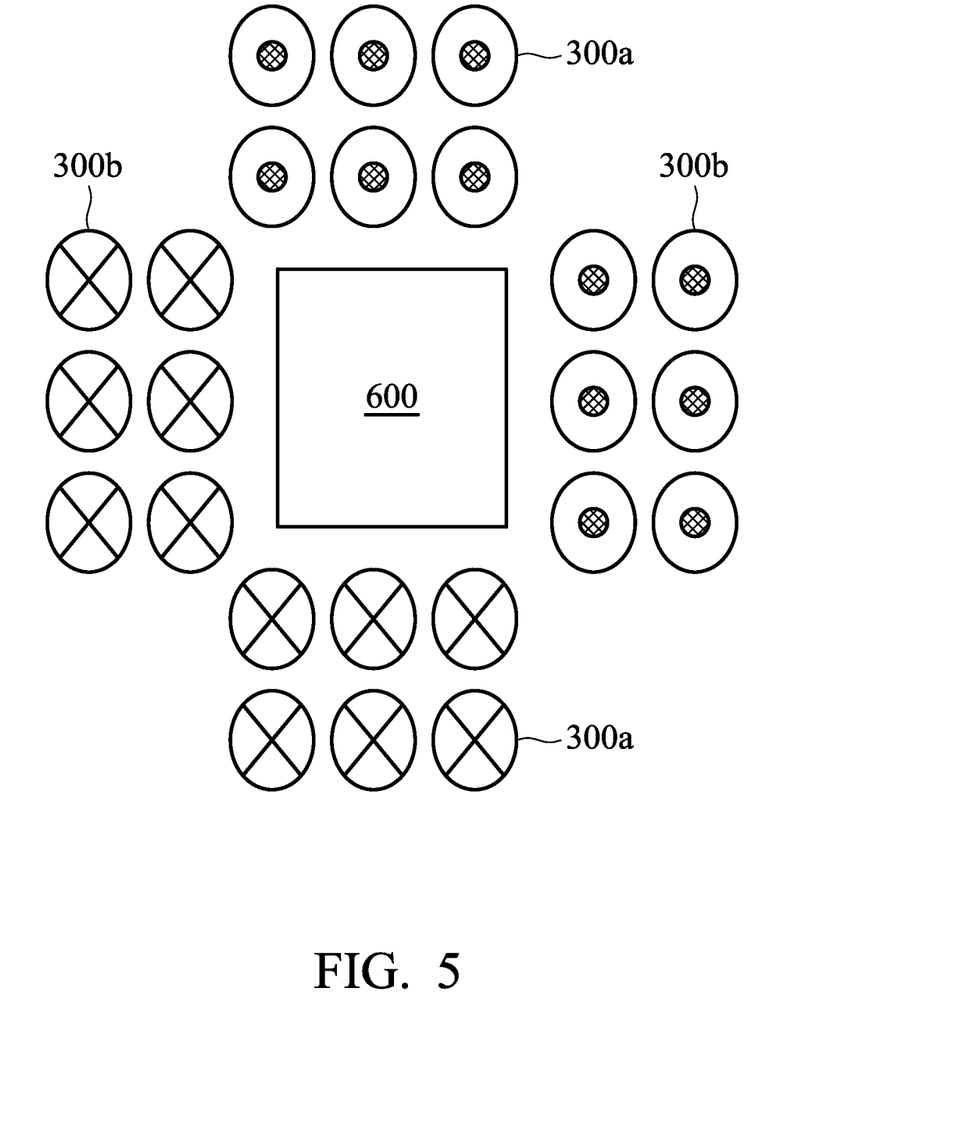
FIG. 5 is an arrangement showing a magnetic field-partitioned non-volatile memory for multi-bit storage using on-chip solenoids to generate an external magnetic field according to an embodiment.

FIG. 5 is an arrangement showing a magnetic field-partitioned non-volatile memory for multi-bit storage using on-chip solenoids to generate external magnetic fields along different directions according to an embodiment. As shown in FIG. 5, the magnetic field-partitioned non-volatile memory comprises a plurality of the non-volatile memory cells for multi-bit storage according to embodiments (for example, the non-volatile memory cells 500a, 500b or 500c or combinations thereof) may be arranged as a non-volatile memory array 600. The non-volatile memory array 600 may be arranged in a single chip. The magnetic field-partitioned non-volatile memory further comprises at least two on-chip solenoids 300a and 300b (dots and crosses shown in FIG. 5 illustrate directions of the current passing through the on-chip solenoid 300a and 300b, the dots indicate that the current flows along a direction pointed out of the paper surface, and the crosses the current flows along a direction pointed into the paper surface) respectively surround the non-volatile memory array 600 to generate external magnetic fields. In one embodiment, the at least two on-chip solenoids 300a and 300b cross each other. In this embodiment as shown in FIG. 5, the on-chip solenoids 300a and 300b cross vertically to each other. When the on-chip solenoids 300a and 300b are coupled to power sources, lines of a magnetic flux through the middle of both the on-chip solenoids 300a and 300b are produced, passing through the non-volatile memory array 600. The produced lines of a magnetic flux through the middle of both the on-chip solenoids 300a and 300b are perpendicular to each other. That is to say, the non-volatile memory array 600 is disposed in a produced external magnetic field in the middle of the on-chip solenoid 300a and another produced external magnetic field in the middle of the on-chip solenoid 300b. Also, the produced external magnetic field in the middle of the on-chip solenoid 300a or 300b is stronger than other positions of the on-chip solenoid 300a or 300b. The produced external magnetic fields in the middle of the on-chip solenoid 300a and the middle of the on-chip solenoid 300b are perpendicular to each other. Accordingly, each of the non-volatile memory cells of the non-volatile memory array 600 are operated (wrote, read or reset) by induced currents from the external magnetic fields produced by the on-chip solenoids along at least two directions. The currents of the non-volatile memory cell induced from the external magnetic fields are along at least two directions, so that at least two bits are stored in different portions of the resistance-changing memory material connecting to the at least two end portions (from the cross section view) of the top electrode or the bottom electrode. Therefore, each of the non-volatile memory cells may store multi bits partitioned by the external magnetic fields along different directions. The non-volatile memory cells according to embodiments (for example, the non-volatile memory cells 500a, 500b or 500c or combinations thereof) may be referred to as "magnetic field-partitioned non-volatile memory cells". Also, the non-volatile memory as shown in FIG. 5 may be referred to as a "magnetic field-partitioned non-volatile memory". If the magnetic field-partitioned non-volatile memory are stacked as a three dimensional (3D) structure, the bit density of the 3D magnetic field-partitioned non-volatile memory structure may be at least double than that of the conventional 3D non-volatile memory structure.

While the disclosure has been described by way of example and in terms of the embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A non-volatile memory cell for multi-bit storage, comprising:
    a bottom electrode;
    a resistance-changing memory material covering the bottom electrode; and
    a top electrode comprising a high-mobility material on the resistance-changing memory material, wherein the top electrode has two post portions supporting a bar-shaped portion;
    wherein at least two bits are stored in portions of the resistance-changing memory material connecting to the top electrode when an external magnetic field is applied along different directions.

2. The non-volatile memory cell for multi-bit storage as claimed in claim 1, where the high-mobility material is indium antimonide, graphene, or carbon nanotubes.

3. The non-volatile memory cell for multi-bit storage as claimed in claim 1, wherein the top electrode has at least two ends respectively overlapping with the bottom electrode, connecting to the resistance-changing memory material from a top view.

4. The non-volatile memory cell for multi-bit storage as claimed in claim 3, wherein the top electrode is stripe shaped from the top view.

5. The non-volatile memory cell for multi-bit storage as claimed in claim 3, wherein an area of the top electrode overlapping with the resistance-changing memory material is smaller than an area of the resistance-changing memory material.

6. The non-volatile memory cell for multi-bit storage as claimed in claim 3, wherein an area of the bottom electrode overlapping with the at least two ends of the top electrode is smaller than a total area of the at least two ends of the top electrode overlapping with the resistance-changing memory material from the top view.

7. A non-volatile memory cell for multi-bit storage, comprising:
    a bottom electrode comprising a high-mobility material, wherein the bottom electrode has an annular portion supported by a cylindrical portion;
    a resistance-changing memory material covering the bottom electrode; and
    a top electrode on the resistance-changing memory material,
    wherein at least two bits are stored in portions of the resistance-changing memory material connecting to the bottom electrode when an external magnetic field is applied along different directions.

8. The non-volatile memory cell for multi-bit storage as claimed in claim 7, where the high-mobility material is indium antimonide, graphene, or carbon nanotubes.

9. The non-volatile memory cell for multi-bit storage as claimed in claim 7, wherein the resistance-changing memory material is circular shaped or ring shaped from a top view.

10. The non-volatile memory cell for multi-bit storage as claimed in claim 9, wherein the top electrode has a ring-shaped surface overlapping with the resistance-changing memory material from a top view.

11. The non-volatile memory cell for multi-bit storage as claimed in claim 10, wherein the bottom electrode fully overlaps with the resistance-changing memory material from the top view.

12. The non-volatile memory cell for multi-bit storage as claimed in claim 11, wherein the resistance-changing memory material is circular shaped, and an area of the top electrode overlapping with the resistance-changing memory material is larger than an area of the bottom electrode connecting to the resistance-changing memory material from the top view.

13. The non-volatile memory cell for multi-bit storage as claimed in claim 11, wherein the resistance-changing memory material is ring shaped, and an area of the bottom electrode overlapping with the resistance-changing memory material is the same as an area of the ring-shaped surface of the top electrode overlapping with the resistance-changing memory material from the top view.

14. The non-volatile memory cell for multi-bit storage as claimed in claim 11, wherein the bottom electrode is circular shaped or ring shaped from the top view.

15. A magnetic field-partitioned non-volatile memory for multi-bit storage, comprising:
   a plurality of non-volatile memory cells as claimed in claim 7 arranged as a non-volatile memory array; and
   at least two on-chip solenoids respectively surrounding the non-volatile memory array to generate external magnetic fields.

16. The magnetic field-partitioned non-volatile memory for multi-bit storage as claimed in claim 15, wherein the at least two on-chip solenoids respectively produce magnetic fields, wherein the magnetic fields respectively produced are perpendicular to each other.

17. A magnetic field-partitioned non-volatile memory for storage, comprising:
   a plurality of non-volatile memory cells as claimed in claim 1 arranged as a non-volatile memory array; and
   at least one on-chip solenoid adjacent the non-volatile memory array to generate an external magnetic field.

\* \* \* \* \*